United States Patent
Kihara (10) Patent No.: US 8,971,071 B2
(45) Date of Patent: Mar. 3, 2015

(54) DRIVER CIRCUIT AND INVERTER CIRCUIT

(75) Inventor: Seiichiro Kihara, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 52 days.

(21) Appl. No.: 13/882,531

(22) PCT Filed: Sep. 26, 2011

(86) PCT No.: PCT/JP2011/071829
§ 371 (c)(1),
(2), (4) Date: Apr. 30, 2013

(87) PCT Pub. No.: WO2012/063563
PCT Pub. Date: May 18, 2012

(65) Prior Publication Data
US 2013/0215653 A1    Aug. 22, 2013

(30) Foreign Application Priority Data

Nov. 10, 2010  (JP) .................. 2010-251729

(51) Int. Cl.
| | |
|---|---|
| H02H 7/122 | (2006.01) |
| H03B 1/00 | (2006.01) |
| H03K 3/00 | (2006.01) |
| H02M 7/5387 | (2007.01) |
| H03K 17/06 | (2006.01) |
| H02H 3/20 | (2006.01) |
| H02M 1/32 | (2007.01) |
| H02M 1/38 | (2007.01) |
| H03K 17/687 | (2006.01) |

(52) U.S. Cl.
CPC .......... *H02H 7/1222* (2013.01); *H02M 7/5387* (2013.01); *H03K 17/063* (2013.01); *H02H 3/20* (2013.01); *H02M 1/32* (2013.01); *H02M 1/38* (2013.01); *H03K 2017/066* (2013.01); *H03K 2017/6875* (2013.01)
USPC ....................... 363/56.02; 327/109

(58) Field of Classification Search
USPC .................. 363/17, 56.02, 98, 132
See application file for complete search history.

(56) References Cited

U.S. PATENT DOCUMENTS

| | | | |
|---|---|---|---|
| 4,740,713 A | 4/1988 | Sakurai et al. | |
| 4,857,763 A | 8/1989 | Sakurai et al. | |
| 6,373,318 B1 * | 4/2002 | Dohnke et al. | 327/434 |
| 6,434,019 B2 * | 8/2002 | Baudelot et al. | 363/16 |
| 7,737,761 B2 * | 6/2010 | Ishikawa et al. | 327/434 |
| 7,872,888 B2 * | 1/2011 | Kuzumaki et al. | 363/98 |
| 2010/0321966 A1 * | 12/2010 | Mochikawa et al. | 327/436 |

FOREIGN PATENT DOCUMENTS

| | | |
|---|---|---|
| JP | 61-172435 A | 8/1986 |
| JP | 2004-242475 A | 8/2004 |
| JP | 2007-159364 A | 6/2007 |

* cited by examiner

*Primary Examiner* — Jue Zhang
(74) *Attorney, Agent, or Firm* — Birch, Stewart, Kolasch & Birch, LLP (57) ABSTRACT

The present invention provides a safe circuit that can prevent an arm short, when a half-bridge circuit is configured by using a normally-on switching element, and the half-bridge circuit is used as a driver circuit or an inverter circuit. In a driver circuit configured by a half-bridge circuit in which one of input and output terminals of a first switching element 14 is connected to a first power-supply voltage V1 on a high-voltage side, and the first switching element 14 and a second switching element 15 are connected in series, a normally-off third switching element 16 is inserted between the second switching element 15 and a second power-supply voltage V2 on a low voltage side. The third switching element 16 is turned off, when an operating voltage VH or VL supplied from control-circuit power supplies 13a and 13b is insufficient for the operation of a control circuit 11.

7 Claims, 5 Drawing Sheets

Conventional Art

DRIVER CIRCUIT AND INVERTER CIRCUIT

CROSS REFERENCE TO RELATED APPLICATIONS

This application is the National Phase of PCT/JP2011/071829 filed on Sep. 26, 2011, which claims priority under 35 U.S.C. 119(a) to Japanese Patent Application No. 2010-251729 filed on Nov. 10, 2010, all of which are hereby expressly incorporated by reference into the present application.

TECHNICAL FIELD

The present invention relates to a driver circuit, and more particularly, to a method of protecting arm short of a half-bridge circuit that is configured by using a switching element having normally-on characteristic in which a threshold voltage is a negative voltage.

BACKGROUND ART

A device using wide-gap semiconductor having a band gap more than 2 eV, represented by GaN-FET (Gallium Nitride-Field Effect Transistor) or SiC-JFET (Silicon Carbide-Junction Field Effect Transistor), has excellent characteristics such as high-speed switching, and low on-resistance, compared to a MOSFET using silicon. On the other hand, many devices exhibit a normally-on characteristic in which a threshold voltage is about −3 V, and a drain current flows even if a gate voltage is 0 V.

A device even using GaN or SiC and having normally-off characteristic has been developed. However, since the threshold voltage is low such as about 2 V, MOSFET using silicon cannot be replaced as it is.

Figure 5:
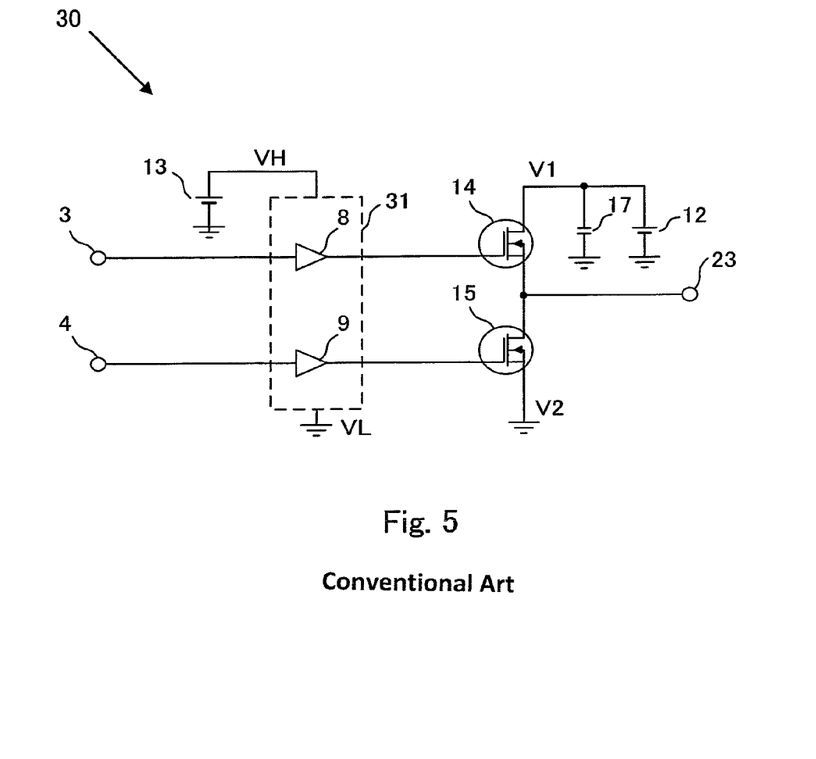
FIG. 5 is a circuit diagram of a driver circuit (inverter circuit) having a conventional structure.

FIG. 5 illustrates a circuit diagram of a driver circuit (inverter circuit) 30 having a conventional structure. FIG. 5 illustrates the case in which a conventional normally-off silicon MOSFET is used as switching elements 14 and 15. A MOSFET 14 on a high-side is turned on or off by a control circuit 8 based upon an input signal from an input control terminal 3, while a MOSFET 15 on a low-side is turned on or off by a control circuit 9 based upon an input signal from an input control terminal 4. As a result, a voltage between a voltage V1 supplied from a power source 12 and a voltage V2 (here, a ground potential) is outputted to an output terminal 23. Operating voltages of the control circuits 8 and 9 are supplied by a voltage VH supplied from an internal power source 13 and a voltage VL (here, a ground potential).

However, when the above-mentioned structure is applied to a normally-on device, and the normally-off MOSFETs 14 and 15 in FIG. 5 are replaced by normally-on devices, the normally-on device is in on-state when a control signal is not inputted to a gate terminal, such as when the driver circuit is started, or when the internal power source 13 in a control circuit 31 is shut down. As a result, the switching elements 14 and 15 are simultaneously in on-state, so that a so-called arm short in which large short-circuit current flows might be caused.

With respect to this problem, Patent Document 1 describes a method in which a gate drive circuit (driver circuit) includes a second power source that is connected to a ground-side of a main power source and that is established in conjunction with the main power source, a negative voltage supplied from the second power source and a gate-on voltage supplied from a control power source are switched by a control signal, and the switched one is outputted to a gate of a switching element. In Patent Document 1, when the control power source is shut down with the main power source being established, an off-voltage from the second power source is applied to the gate of the low-side switching element, whereby arm short can be prevented.

PRIOR ART DOCUMENT

Patent Document

Patent Document 1: Japanese Patent Application Laid-Open No. 2004-242475

SUMMARY OF THE INVENTION

Problems to be Solved by the Invention

As described above, in the structure of an inverter circuit that is connected to a high-voltage power source, a normally-on device might cause arm short in unavoidable condition such as upon the starting or when the power source is shut down. Therefore, the normally-on device is difficult to use as a power device.

As a countermeasure for the problem described above, Patent Document 1 describes that even when the control power source is shut down, the low-side switching element can be kept to be in off-state, since the second power source that is established in conjunction with the main power source is provided. However, when the second power source is broken down, or when malfunction occurs, the off-state cannot be kept, with the result that the method in Patent Document 1 cannot cope with the occurrence of arm short.

The present invention is accomplished in view of the above-mentioned circumstance, and aims to eliminate a danger of arm short caused by the application of the normally-on switching element to the driver circuit, and more particularly, to provide a safe driver circuit without deteriorating a high-speed switching and low on-resistance brought by the application of a device using a wide-gap semiconductor.

Means for Solving the Problem

A driver circuit according to the present invention to attain the above aim has a first aspect that the driver circuit includes a first switching element having a pair of input-output terminals, one end of which is connected to a first power-supply voltage, and a second switching element connected in series to the other end of the pair of input-output terminals of the first switching element, and outputs a voltage of an intermediate node between the first switching element and the second switching element, the first and the second switching elements including wide-gap semiconductor, and having a normally-on characteristic, the driver circuit comprising:

a third switching element having a normally-off characteristic, and having a pair of input-output terminals, one end of which is connected to one end, not connected to the first switching element, of the input-output terminals of the second switching element, and the other end of which is connected to a second power-supply voltage lower than the first power-supply voltage;

a first control circuit that outputs a first control signal for controlling on/off of the first switching element to a control terminal of the first switching element based upon an input signal;

a second control circuit that outputs a second control signal for controlling on/off of the second switching element to a control terminal of the second switching element based upon an input signal;

a third control circuit that outputs a third control signal for controlling on/off of the third switching element to a control terminal of the third switching element; and a control-circuit power supply that supplies an operating voltage required for the operations of the first control circuit and the second control circuit, wherein the third control circuit compares the operating voltage with a predetermined value, and when the operating voltage is insufficient for the operation of the control circuit as a result of the comparison, the third control circuit turns off the third switching element.

According to the driver circuit of the first aspect, the normally-off third switching element is inserted between the second switching element and the second power-supply voltage, and when the operating voltage supplied to the control circuit is insufficient, the third switching element is turned off. With this structure, the third switching element is in off-state, when the driver circuit is started, or when an internal power supply 13 of the control circuit is shut down. Therefore, the arm short can be prevented.

Since the element using the wide-gap semiconductor is used as the first switching element or the second switching element, the switching element having low on-resistance and high-speed switching characteristic can be realized, whereby the high-speed operation and reduced power consumption of the driver circuit can be attained.

Further, the driver circuit according to the first aspect of the present invention has a second aspect that the driver circuit comprises:

a first resistor having one end connected to the control terminal of the second switching element, and the other end connected to the second power-supply voltage; and a second resistor having one end connected to the control terminal of the third switching element and the other end connected to the second power-supply voltage.

The driver circuit according to the second aspect includes the first and second resistors. Accordingly, when the control signal is not inputted to the control terminals of the second and third switching elements, the second power-supply voltage is supplied to the control terminals via the first and second resistors. In this case, since the third switching element is off, the electrical potential of the connection node between the second switching element and the third switching element rises. However, since the application of the second power-supply voltage to the control terminal of the second switching element via the first resistor is continued, the voltage applied to the control terminal of the second switching element becomes a negative voltage with respect to the electrical potential of the connection node. Accordingly, when the electrical potential of the connection node increases by more than the absolute value of the threshold voltage of the second switching element with respect to the second power supply voltage, the second switching element is automatically turned off.

Thus, an element having a low breakdown voltage can be used as the third switching element. Further, a compact element having small on-resistance can be used. Accordingly, the affect caused by the addition of the third switching element can be minimized.

Further, the driver circuit according to the first or second aspect of the present invention has a third aspect that the control-circuit power supply supplies a third power-supply voltage higher than the second power-supply voltage to the first control circuit and the second control circuit as the operating voltage, and the third control circuit turns off the third switching element, when the third power-supply voltage supplied from the control-circuit power supply is lower than a predetermined value.

According to the driver circuit of the third aspect, when the third power-supply voltage (positive voltage) supplied from the control-circuit power supply is lower than a predetermined value, and is insufficient for the operating voltage of the control circuit, the third switching element is turned off. Accordingly, the arm short caused by the defect of the positive voltage can be prevented.

Further, the driver circuit according to any one of the first to third aspects of the present invention has a fourth aspect that the control-circuit power supply supplies a fourth power-supply voltage lower than the second power-supply voltage to the first control circuit and the second control circuit as the operating voltage, and the third control circuit turns off the third switching element, when the fourth power-supply voltage supplied from the control-circuit power supply is higher than a predetermined value.

According to the driver circuit of the fourth aspect, when the fourth power-supply voltage (negative voltage) supplied from the control-circuit power supply is higher than a predetermined value, and is insufficient for the operating voltage of the control circuit, the third switching element is turned off. Accordingly, the arm short caused by the defect of the negative voltage can be prevented.

Further, in the driver circuit according to any one of the first to fourth aspects of the present invention, it is preferable that at least either one of the wide-gap semiconductor forming the first switching element and the wide-gap semiconductor forming the second switching element is GaN or SiC.

The driver circuit according to any one of the first to fourth aspects can be preferably utilized as an inverter circuit that converts DC into AC.

Further, more preferably, in the driver circuit according to any one of the first to fourth aspects, an inverter circuit having plural phases can be formed by providing a plurality of series circuits including the first switching element and the second switching element, wherein one terminal of the second switching element in each of the plurality of series circuits is connected to the third switching element in common.

Effect of the Invention

According to the present invention, the danger of the arm short caused by the application of the normally-on switching element can be eliminated, and a safe driver circuit or inverter circuit having high-speed switching characteristic and low on-resistance can be provided.

BEST MODE FOR CARRYING OUT THE INVENTION

First Embodiment

Figure 1:
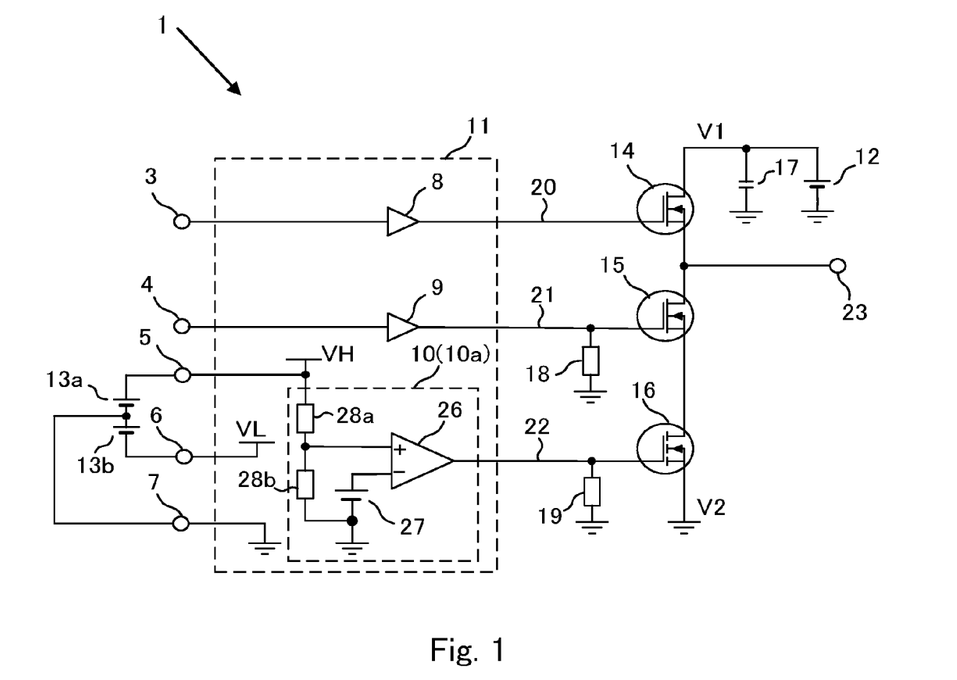
FIG. 1 is a circuit diagram illustrating an example of a structure of a driver circuit (inverter circuit) according to the present invention.

FIG. 1 illustrates an example of a structure of a driver circuit (inverter circuit) 1 according to one embodiment of the present invention (hereinafter referred to as "present circuit 1" according to need). The same components are identified by the same numerals in all figures used for the description of the embodiments, and the name and function are the same, so that the similar description will not be repeated.

As illustrated in the circuit block diagram in FIG. 1, the present circuit 1 includes a control circuit 11, a high-voltage power supply 12, a control-circuit power supply having power supplies 13a and 13b, a high-side first switching element 14, a low-side second switching element 15, a third switching element 16, a capacitor 17, and resistors 18 and 19.

A drain (one end of a pair of input-output terminals) of the first switching element 14 is connected to a positive voltage V1 (first power-supply voltage) supplied from the high-voltage power supply 12, and a source (the other end of the pair of input-output terminals) is connected to a drain of the second switching element 15, whereby a half-bridge circuit in which the first switching element 14 and the second switching element 15 are connected in series is formed. On the other hand, the source of the second switching element 15 is connected to a drain of the third switching element 16. The first switching element 14 and the second switching element 15 are respectively a normally-on n-channel FET made of wide-gap semiconductor having a threshold voltage Vth of about −3 V. Preferably, they are n-channel FET using GaN or SiC as the wide-gap semiconductor. For example, in the case of GaN, GaN-HEMT (High Electron Mobility Transistor) can be used, and in the case of SiC, SiC-JFET can be utilized. The positive voltage V1 is about 600 V, for example.

The third switching element 16 is a normally-off FET. Its drain (one end of a pair of input-output terminals) is connected to the source of the second switching element 15, while its source (the other end of the pair of input-output terminals) is connected to a second power-supply voltage V2 (here, a ground potential). The present circuit 1 has a structure in which the third switching element 16 is inserted between the second switching element 15 and the second power-supply voltage V2 in an arm of the conventional inverter circuit configured by the first power-supply voltage V1—first switching element 14—second switching element 15—second power-supply voltage V2. The third switching element 16 may be a general low-breakdown MOSFET having a breakdown voltage of about 30 V, for example.

A negative side of the power supply 13a is connected to the second power-supply voltage, while a positive side is connected to a negative terminal of the control circuit 11, and supplies a third voltage VH, which is a terminal voltage at the positive side, to the control circuit 11 via a control voltage terminal 5.

A positive side of the power supply 13b is connected to the second power-supply voltage, while a negative side is connected to the negative terminal of the control circuit 11, and supplies a fourth voltage VL, which is a terminal voltage at the negative side, to the control circuit 11 via a power-supply terminal 6.

Since the voltage on the connection node between the power supply 13a and the power supply 13b is connected to the second power-supply voltage V2, the third power-supply voltage VH becomes a positive voltage with respect to the second power-supply voltage V2, and the fourth power-supply voltage VL becomes a negative voltage with respect to the second power-supply voltage V2. The negative voltage VL is lower than a negative threshold voltage Vth of the first switching element 15 and the second switching element 16 having the normally-on characteristic. For example, it is about −10 V. The second power-supply voltage V2 is also supplied to the control circuit 11 via a power-supply terminal 7.

The control circuit 11 includes a high-side driver (first control circuit) 8, a low-side driver (second control circuit) 9, and a third control circuit 10 (10a), and operates with the second power-supply voltage V2, the third voltage VH from the power supply 13a, and the fourth voltage VL from the power supply 13b, as the operating voltage. The high-side driver 8 generates a first control signal 20 for controlling on/off of the first switching element 14 based upon the input control signal from a high-side drive signal terminal 3, and outputs the resultant to the gate of the first switching element 14. The low-side driver 9 generates a second control signal 21 for controlling on/off of the second switching element 15 based upon the input control signal from a low-side drive signal terminal 4, and outputs the resultant to the gate of the second switching element 15.

The third control circuit 10a includes a comparator 26, a reference voltage source 27, and two resistors 28a and 28b connected in series. The voltage of the connection node between the resistors 28a and 28b is inputted to a non-inverting input terminal of the comparator 26, and the voltage on the positive side of the reference voltage source 27 is inputted to an inverting input terminal of the comparator 26. The resistors 28a and 28b divide the operating voltage VH of the driver circuit 11 supplied from the power supply 13a, and the comparator 26 compares the divided voltage to the reference voltage of the reference voltage source 27. When the divided voltage is lower than the reference voltage, i.e., when the operating voltage VH is insufficiently low for the operation of the driver circuit 11, the comparator 26 outputs a low-level signal (third control signal) 22 for turning off the third switching element 16 to the gate of the third switching element 16. On the other hand, when the divided voltage is not less than the reference voltage, and the operating voltage VH is sufficient for the operation of the driver circuit 11, the comparator 26 outputs a high-level signal (third control signal) 22 for turning on the third switching element 16 to the gate of the third switching element 16.

One end of the resistor 18 is connected to the gate of the second switching element 15, while the other end is connected to the second power-supply voltage V2. One end of the resistor 19 is connected to the gate of the third switching element 16, while the other end is connected to the second power-supply voltage V2.

The capacitor 17 has a function of reducing the voltage variation of the high-voltage power supply 12 caused by the sharp change in the current flowing through the output terminal 23 via the first switching element 14, in order to supply the stable first power-supply voltage V1 to the drain of the first switching element.

The operation of the present circuit 1 will next be described with reference to FIG. 1.

When the present circuit 1 is started to supply, to the control circuit 11, the positive voltage (third voltage) VH from the power supply 13a, the negative voltage (fourth voltage) VL from the power supply 13b, and the second voltage V2 via the power-supply terminal 7, the third control circuit 10a compares the reference voltage source 27 and the voltage VH on the control voltage terminal 5 divided by the resistors 28a and 28b. When the voltage VH is equal to or higher than a predetermined value, the third control circuit 10a generates the output signal 22 for turning on the third switching element 16 to bring the third switching element 16 into on-state.

When the third switching element 16 is a general low-breakdown MOSFET having a breakdown voltage of 30 V, the on-resistance of the MOSFET is about 1.5 mΩ, so that a loss of about 0.015 W is caused with the drain current of 10 A. However, when the inverter circuit 1 operates with 600 V and 10 A, the loss is about 0.00025% of the total. Therefore, the loss by the third switching element 16 can be neglected.

Signals having a complementarity relation are inputted to the high-side drive signal terminal 3 and the low-side drive signal terminal 4 for preventing the occurrence of the arm short.

The high-side driver 8 shifts the level of the input signal from the high-side drive signal terminal 3 by using the voltage of the output terminal 23 as the reference, for example, so as to convert the input signal into a signal driving the gate of the first switching element 14, and outputs the first control signal 20 to the gate of the first switching element 14.

The low-side driver 9 shifts the level of the input signal from the low-side drive signal terminal 4 so as to convert the input signal into a signal driving the gate of the second switching element 15, and outputs the second control signal 21 to the gate of the second switching element 15. As a result, the voltage formed by switching the voltage of the high-voltage power supply 23 is outputted to the output terminal 23.

It is supposed here that the third voltage VH supplied to the control circuit 11 from the power supply 13a decreases. When the voltage VH decreases below a predetermined value, the level of the third control signal 22 that is the output from the comparator 26 in the third control circuit 10a becomes low, so that the third switching element 16 is turned off. Thus, this operation can prevent the arm short from occurring.

Next, it is supposed that the third voltage VH supplied to the control circuit 11 from the power supply 13a decreases, or the level of the third voltage VH is low upon the starting, and hence, the control circuit 11 is not operated. In this case, since one end of the resistor 18 is connected to the gate of the second switching element 15, and the other end of the resistor 18 is connected to the second power-supply voltage V2, the second power-supply voltage V2 is applied to the gate of the second switching element 15.

Similarly, since one end of the resistor 19 is connected to the gate of the third switching element 16, and the other end of the resistor 19 is connected to the second power-supply voltage V2, the second power-supply voltage V2 is applied to the gate of the third switching element 16. The first and second switching elements 15 and 16 have the normally-on characteristic, and the third switching element 16 has the normally-off characteristic. Therefore, the first and second switching elements 15 and 16 are in on-state, while the third switching element 16 is in off-state. Thus, the drain voltage of the third switching element 16 (source voltage of the second switching element 15) increases.

However, since the application of the second power-supply voltage V2 to the gate of the second switching element 15 is continued via the resistor 18, the gate voltage of the second switching element 15 becomes negative voltage with respect to the source voltage with the increase in the drain voltage of the third switching element 16. When the drain voltage of the third switching element 16 increases by more than the absolute value of the threshold voltage Vth of the second switching element 15 with respect to the second power supply voltage V2, the second switching element 15 is turned off.

As a result, the connection between the first power-supply voltage V1 and the second power-supply voltage V2 is disconnected by the second switching element 15. Accordingly, even when the control circuit 11 does not operate, the arm short can be prevented.

When the resistors 18 and 19 are not provided, the first and second switching elements are on, and the third switching element is off under the condition that the control circuit 11 does not operate. Therefore, the high voltage V1 from the high-voltage power supply 12 is applied between the source and the drain of the third switching element. Accordingly, the element having high breakdown voltage is demanded for the third switching element 16.

However, in the present circuit 1, since the resistors 18 and 19 are provided, the second switching element is temporarily turned on, but when the voltage between the source and the drain of the third switching element 16 increases to be equal to or higher than the absolute value of the threshold voltage Vth of the second switching element 15 afterward, the second switching element 15 is turned off, as described above. According to the high-speed switching characteristic of the second switching element 15 using the wide-gap semiconductor, the voltage application from the high-voltage power supply 12 to the third switching element 16 is blocked.

The absolute value of the threshold voltage Vth of the second switching element 15 is about 3 V at most as described above. Thus, a low-breakdown-voltage device can be employed as the third switching element 16, whereby more compact device having low on-resistance compared to the high-breakdown-voltage device can be employed.

Figure 2:
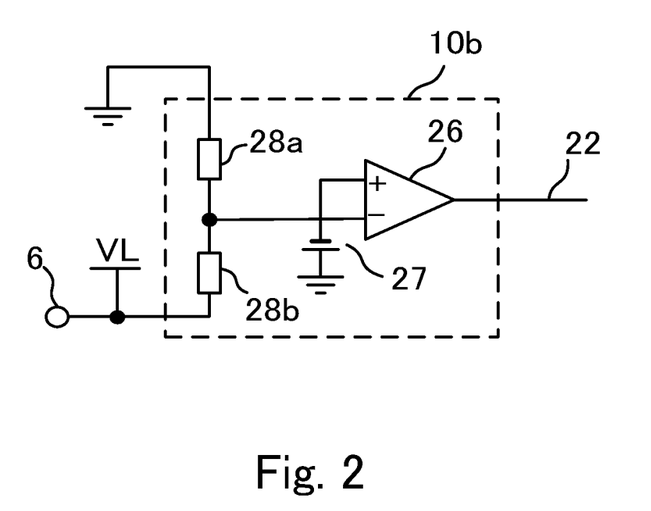
FIG. 2 is a circuit diagram illustrating an example of another structure of a third control circuit controlling a third switching element in the driver circuit according to the present invention.

FIG. 2 illustrates an example of another structure of the third control circuit 10 controlling the third switching element 16 in the present circuit 1. The third control circuit 10b illustrated in FIG. 2 includes a comparator 26, a reference voltage source 27, and two resistors 28a and 28b connected in series, like the control circuit 10a described above. However, the control circuit 10b is different from the control circuit 10a in that the voltage of the connection node between the resistors 28a and 28b is inputted to the inverting input terminal of the comparator 26, while the voltage on the negative side of the reference voltage source 27 is inputted to the non-inverting input terminal of the comparator 26. The resistors 28a and 28b divide the operating voltage VL (negative voltage) of the control circuit 11 supplied from the power supply 13b, and the comparator 26 compares the divided voltage with the negative reference voltage of the reference voltage source 27. When the divided voltage is higher than the reference voltage, i.e., when the operating voltage VL is insufficiently high for the operation of the driver circuit 11, the comparator 26 outputs the low-level signal (third control signal) 22 for turning off the third switching element 16 to the gate of the third switching element 16. On the other hand, when the divided voltage is not more than the reference voltage, and the operating voltage VL is sufficient for the operation of the driver circuit 11, the comparator 26 outputs the high-level signal (third control signal) 22 for turning on the third switching element 16 to the gate of the third switching element 16.

With this structure, when the negative voltage VL is higher than the predetermined value, the third switching element 16 is turned off. Accordingly, the arm short caused by the defect of the negative voltage can be prevented.

Figure 3:
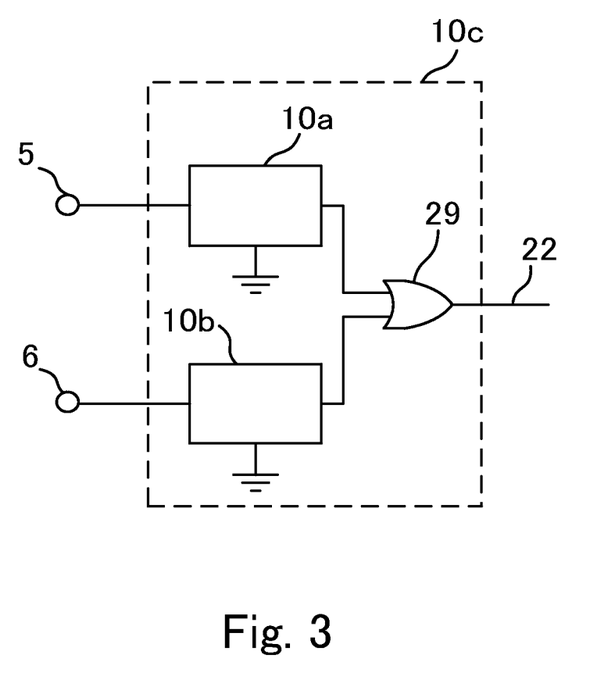
FIG. 3 is a circuit diagram illustrating an example of another structure of a third control circuit controlling a third switching element in the driver circuit according to the present invention.

FIG. 3 illustrates an example of another structure of the third control circuit 10 controlling the third switching element 16 in the present circuit 1. As illustrated in FIG. 3, the control circuit 10c includes the control circuit 10a in FIG. 1 and the control circuit 10b in FIG. 2, wherein OR of the outputs of the respective comparators 26 is calculated in an OR circuit 29, and the signal of the OR is defined as the signal (third control signal) 22 for controlling the third switching element 16.

Thus, when the positive voltage VH is lower than the predetermined value, or when the negative voltage VL is higher than the predetermined value, the third switching element 16 is turned off, whereby the arm short caused by the defect of the positive voltage or negative voltage can be prevented.

Second Embodiment

Figure 4:
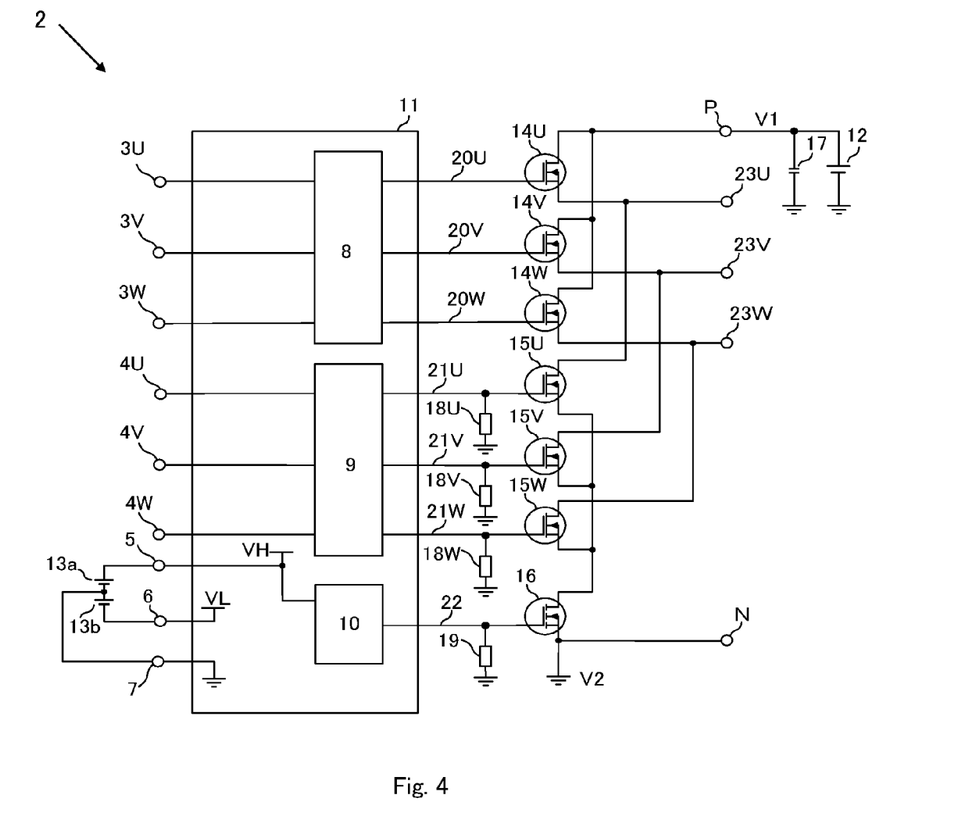
FIG. 4 is a circuit diagram illustrating an example of an inverter that is configured by the driver circuit according to the present invention for outputting three-phase AC.

FIG. 4 illustrates an example of a structure of an inverter circuit 2 according to one embodiment of the present invention (hereinafter referred to as "present circuit 2" according to need). As illustrated in FIG. 4, the present circuit 2 is an example of an inverter circuit, which supplies three-phase AC voltage for driving a three-phase AC motor or the like, by using the present circuit 1 described in the first embodiment. Like the present circuit 1, the present circuit 2 includes a control circuit 11, a high-voltage power supply 12, a control-circuit power supply having power supplies 13a and 13b, high-side first switching elements 14U, 14V, and 14W, low-side second switching elements 15U, 15V, and 15W, a third switching element 16, a capacitor 17, and resistors 18U, 18V, 18W, and 19.

The control circuit 11 includes a high-side driver (first control circuit) 8, a low-side driver (second control circuit) 9, and a third control circuit 10 (10a), and operates with the second power-supply voltage V2, the third voltage VH from the power supply 13a, and the fourth voltage VL from the power supply 13b, as the operating voltage.

Input signals, each of which has a phase shifted by 120 degrees with one another, are inputted to the high-side driver 8 from high-side drive signal terminals 3U, 3V, and 3W. The high-side driver 8 generates first control signals 20U, 20V, and 20W for controlling on/off of the first switching elements 14U, 14V, and 14W based upon the input signals, and outputs the resultant to the gate of each of the first switching elements.

Input signals, each of which has a phase shifted by 120 degrees with one another, and has a complementarity relation with the signals inputted to the high-side drive signal terminals 3U, 3V, and 3W, are inputted to the low-side driver 9 from low-side drive signal terminals 4U, 4V, and 4W. The low-side driver 9 generates second control signals 21U, 21V, and 21W for controlling on/off of the second switching elements 15U, 15V, and 15W based upon the input signals, and outputs the resultant to the gate of each of the second switching elements.

The circuit structure of any one of the above-mentioned control circuits 10a, 10b, and 10c can be used as the third control circuit 10.

In the present circuit 2, the first switching element 14U is connected to the second switching element 15U in series, the first switching element 14V is connected to the second switching element 15V in series, and the first switching element 14W is connected to the second switching element 15W in series. Thus, the three pairs, each of the pairs having the first and second switching elements, form a series circuit. In the series circuit, the voltage of the connection node between the first switching element and the second switching element is outputted to the corresponding output terminals 23U, 23V, and 23W, respectively. In each of the series circuits, the first switching element is commonly connected to the first power-supply voltage V1, and the second switching element is commonly connected to the third switching element. The second switching elements 15U, 15V, and 15W and the third switching element are connected to the second power-supply voltage V2 via the resistors 18U, 18V, 18W, and 19, respectively.

The first switching elements 14U, 14V, and 14W and the second switching elements 15U, 15V, and 15W are respectively a normally-on n-channel FET made of wide-gap semiconductor having a threshold voltage Vth of about −3 V. Preferably, they are n-channel FET using GaN or SiC as the wide-gap semiconductor. The first switching element 16 may be a general low-breakdown MOSFET having a breakdown voltage of about 30 V, for example.

The operation of the present circuit 2 is almost the same as the operation of the above-mentioned present circuit 1, except that on/off control is made by a pair of the first switching element 14U and the second switching element 15U, a pair of the first switching element 14V and the second switching element 15V, and a pair of the first switching element 14W and the second switching element 15W. When the voltage VH or VL supplied to the control circuit 11 is insufficient for the operation of the control circuit 11, or when the control circuit 11 does not operate, the third switching element is turned off, whereby the arm short can be prevented.

Even in the three-phase inverter, all phases can be blocked by using only one third switching element 16. Accordingly, the circuit can be compact and safe, compared to the case where the individual phase is blocked.

In the first and second embodiments, one end of the dividing resistor 28b in the third control circuit 10 (10a to 10c) and one end of the reference voltage source 27 are connected to the second power-supply voltage (ground potential). However, the destination of the connection is not particularly limited, so long as one end of them is connected to a predetermined fixed potential. In addition, in the structure in FIG. 1, when the variation in the fourth power-supply voltage VL supplied from the power supply 13b can be neglected, the negative-side input terminal of the comparator 26 is connected to the ground potential, and one end of the resistor 28b is connected to the voltage VL, whereby the reference voltage source 27 becomes unnecessary.

The embodiments described above are one example of preferable embodiments of the present invention. The embodiments of the present invention are not limited thereto, and various modifications are possible without departing from the scope of the present invention.

INDUSTRIAL APPLICABILITY

The present invention is applicable to a driver circuit that supplies a voltage for controlling to a control terminal of a switching element, and more preferably, to an inverter circuit including a half-bridge circuit in which switching elements having a normally-on characteristic are connected in series.

EXPLANATION OF REFERENCES

1: Drive circuit according to present invention (inverter circuit)
2: Inverter circuit according to present invention
3, 3U, 3V, 3W: High-side drive signal terminal
4, 4U, 4V, 4W: Low-side drive signal terminal
5: Control voltage terminal
6, 7: Power-supply terminal
11: Control circuit according to present invention
8: First control circuit (high-side driver)
9: Second control circuit (low-side driver)
10, 10a to 10c: Third control circuit
12: High-voltage power supply
13, 13a, 13b: Control-circuit power supply
14, 14U, 14V, 14W: First switching element (high-side)
15, 15U, 15V, 15W: Second switching element (low-side)

16: Third switching element
17: Capacitor
18U, 18V, 18W, 19: Resistor
20, 20U, 20V, 20W: First control signal
21, 21U, 21V, 21W: Second control signal
22: Third control signal
23, 23U, 23V, 23W: Output terminal
26: Comparator
27: Reference voltage source
28a, 28b: Dividing resistor
29: OR circuit
30: Driver circuit (inverter circuit) having conventional structure
31: Control circuit having conventional structure
V1: First power-supply voltage
V2: Second power-supply voltage
VH: Third power-supply voltage
VL: Fourth power-supply voltage

The invention claimed is:

1. A driver circuit that includes a first switching element having a pair of input-output terminals, one end of which is connected to a first power-supply voltage, and a second switching element connected in series to the other end of the pair of input-output terminals of the first switching element, and that outputs a voltage of an intermediate node between the first switching element and the second switching element, the first and the second switching elements including wide-gap semiconductor, and having a normally-on characteristic, the driver circuit comprising:
a third switching element having a normally-off characteristic, and having a pair of input-output terminals, one end of which is connected to one end, not connected to the first switching element, of the input-output terminals of the second switching element, and the other end of which is connected to a second power-supply voltage lower than the first power-supply voltage;
a first control circuit that outputs a first control signal for controlling on/off of the first switching element to a control terminal of the first switching element based upon an input signal;
a second control circuit that outputs a second control signal for controlling on/off of the second switching element to a control terminal of the second switching element based upon an input signal;
a third control circuit that outputs a third control signal for controlling on/off of the third switching element to a control terminal of the third switching element; and
a control-circuit power supply that supplies an operating voltage required for operations of the first control circuit and the second control circuit, wherein
the third control circuit compares the operating voltage with a predetermined value, and when the operating voltage is insufficient for an operation of the control circuit as a result of the comparison, the third control circuit turns off the third switching element.

2. The driver circuit according to claim 1, comprising:
a first resistor having one end connected to the control terminal of the second switching element, and the other end connected to the second power-supply voltage; and
a second resistor having one end connected to the control terminal of the third switching element and the other end connected to the second power-supply voltage.

3. The driver circuit according to claim 1, wherein the control-circuit power supply supplies a third power-supply voltage higher than the second power-supply voltage to the first control circuit and the second control circuit as the operating voltage, and
the third control circuit turns off the third switching element, when the third power-supply voltage supplied from the control-circuit power supply is lower than a predetermined value.

4. The driver circuit according to claim 1, wherein the control-circuit power supply supplies a fourth power-supply voltage lower than the second power-supply voltage to the first control circuit and the second control circuit as the operating voltage, and
the third control circuit turns off the third switching element, when the fourth power-supply voltage supplied from the control-circuit power supply is higher than a predetermined value.

5. The driver circuit according to claim 1, wherein at least either one of the wide-gap semiconductor forming the first switching element and the wide-gap semiconductor forming the second switching element is GaN.

6. The driver circuit according to claim 1, wherein at least either one of the wide-gap semiconductor forming the first switching element and the wide-gap semiconductor forming the second switching element is SiC.

7. An inverter circuit having plural phases in the driver circuit according to claim 1, the inverter circuit comprising:
a plurality of series circuits including the first switching element and the second switching element, wherein
one terminal of the second switching element in each of the plurality of series circuits is connected to the third switching element in common.

* * * * *